(12) United States Patent
Chen et al.

(10) Patent No.: US 8,471,250 B2
(45) Date of Patent: Jun. 25, 2013

(54) DISPLAY APPARATUS

(75) Inventors: Chien-Kai Chen, Taipei (TW); Chen-Hsien Liao, Taipei (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 13/439,875

(22) Filed: Apr. 5, 2012

(65) Prior Publication Data

US 2013/0134461 A1 May 30, 2013

(30) Foreign Application Priority Data

Nov. 25, 2011 (TW) .............................. 100143333 A

(51) Int. Cl.
*H01L 51/50* (2006.01)

(52) U.S. Cl.
USPC .............. 257/40; 257/E51.022; 257/E51.018; 313/504; 313/506

(58) Field of Classification Search
USPC ............... 257/40, E51.018, E51.02, E51.022, 257/E51.021; 313/504, 506, 512
See application file for complete search history.

(56) References Cited

U.S. PATENT DOCUMENTS

| | | | |
|---|---|---|---|
| 7,511,420 B2 | 3/2009 | Adachi et al. | |
| 7,573,493 B2 | 8/2009 | Brown Elliott et al. | |
| 7,816,859 B2 | 10/2010 | Spindler et al. | |
| 2011/0121320 A1* | 5/2011 | Pieh et al. | 257/79 |

FOREIGN PATENT DOCUMENTS

TW I268120 12/2006

* cited by examiner

*Primary Examiner* — Calvin Lee
*Assistant Examiner* — Scott Stowe
(74) *Attorney, Agent, or Firm* — Jianq Chyun IP Office

(57) ABSTRACT

A display apparatus includes an organic electroluminescence (OEL) device and a color filter. At different correlated color temperatures (CCTs), a light emitting spectrum of the OEL device is adjusted to meet specific display requirements and improve the display quality of the display apparatus. In addition, a light filtering spectrum of the color filter is adjusted simultaneously to match the light emitting spectrum of the OEL device, so that the display apparatus has an excellent display effect.

10 Claims, 5 Drawing Sheets

DISPLAY APPARATUS

CROSS-REFERENCE TO RELATED APPLICATION

This application claims the priority benefit of Taiwan application serial no. 100143333, filed on Nov. 25, 2011. The entirety of the above-mentioned patent application is hereby incorporated by reference herein and made a part of this specification.

BACKGROUND

1. Technical Field

The present disclosure generally relates to a display apparatus, in particular, to an organic electroluminescence (OEL) display apparatus.

2. Description of Related Art

An OEL device is a semiconductor device that can convert electrical energy into light energy, and has the advantages of high conversion efficiency, wide angle of view, simple process, low cost, high response speed, wide useful temperature range, and full color. As the advantages meet the requirements for display characteristics of multimedia age, the OLE devices are widely applied in light-emitting devices such as indicating lamps and displays.

In order to achieve full-color display, different OEL displays needs to use with suitable full-color technologies. Presently, according to a full-color technology that is commonly used in the market, a white light OEL device is used as a light source to perform full-color display in combination with a color filter.

It is well known that, in order to make the white light OEL display to achieve specific color performance, it is a most direct method to change the structure of the OEL device, for example, to change the material of organic material layers. However, this method will influence the luminous efficiency and service life of the OEL device, resulting in the unpredictability in product design. That is to say, the conventional white light OEL display cannot meet the requirements in practical applications due to the limitations.

SUMMARY

Accordingly, the present disclosure provides a display apparatus, which includes an OEL device and a color filter. The OEL device is used for emitting light. A curve of a relationship between the light intensity and the wavelength of the light has a peak in a band of 420 nm to 480 nm, a band of 480 nm to 540 nm, and a band of 590 nm to 650 nm. Moreover, the color filter is used for receiving and converting the light into color light. A correlated color temperature (CCT) of a white screen displayed by the display apparatus is in the range of 8000K to 12000K, and a curve of a relationship between the light intensity and the wavelength of the white screen has a first peak in a band of 420 nm to 480 nm, a band of 480 nm to 540 nm, and a band of 590 nm to 650 nm. A ratio of the second peak to the first peak is in the range of 0.31 to 0.40.

In the display apparatus, a ratio of the third peak to the first peak is, for example, in the range of 0.24 to 0.32.

The present disclosure provides another display apparatus, which includes an OEL device and a color filter. The OEL device is used for emitting light. A curve of a relationship between the light intensity and the wavelength of the light has a peak in a band of 420 nm to 480 nm, a band of 480 nm to 540 nm, and a band of 590 nm to 650 nm respectively. Moreover, the color filter is used for receiving and converting the light into color light. A CCT of a white screen displayed by the display apparatus is in the range of 4500K to 8500K, and a curve of a relationship between the light intensity and the wavelength of the white screen has a first peak, a second peak, and a third peak in a band of 420 nm to 480 nm, a band of 480 nm to 540 nm, and a band of 590 nm to 650 nm. A ratio of the second peak to the first peak is in the range of 0.43 to 0.52.

In the display apparatus, a ratio of the third peak to the first peak is in the range of 0.34 to 0.42.

The two display apparatuses have the following color performance in the CIE1931 chromaticity diagram:

$0.63 \leq Rx \leq 0.65$, $0.32 \leq Ry \leq 0.345$;
$0.285 \leq Gx \leq 0.315$, $0.59 \leq Gy \leq 0.615$;
$0.135 \leq Bx \leq 0.155$, $0.04 \leq By \leq 0.065$; and
$0.27 \leq Wx \leq 0.33$, $0.28 \leq Wy \leq 0.35$.

In the two display apparatuses, a curve of a relationship between the filter wavelength and the light intensity of the color filter has, for example, a fourth peak in a band of 430 nm to 460 nm and a fifth peak in a band of 510 nm to 560 nm, and the fifth peak is greater than the fourth peak.

In the two display apparatuses, a ratio of the light intensity when the filter wavelength of the color filter is 650 nm to the light intensity when the filter wavelength is 580 nm is greater than 18.

Based on the above, according to the present disclosure, the light emitting spectrum of the OEL device is adjusted, so that the color performance of the display apparatus can meet various display requirements. Furthermore, the present disclosure can simultaneously select the filter spectrum of the color filter, so that the filter spectrum can match the light emitting spectrum of the OEL device, so as to achieve good display effect.

In order to make the aforementioned and other objectives and advantages of the present disclosure comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
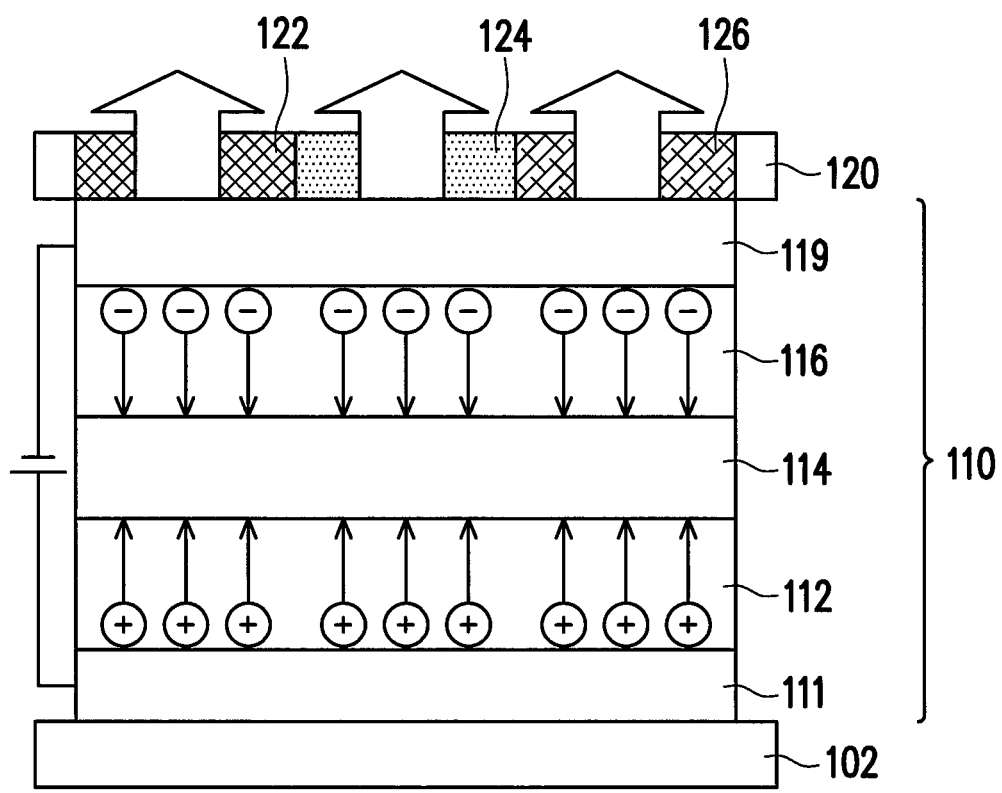
FIG. 1 shows a display apparatus according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 shows a display apparatus according to an embodiment of the present invention. As shown in FIG. 1, the display apparatus 100 includes an OEL device 110 and a color filter 120. The OEL device 110 is disposed on a substrate 102, and includes an anode 111, a hole injection layer 112, an organic light-emitting layer 114, an electron injection layer 116, and a cathode 119. However, the structure of actual OEL device 110 is not limited thereto, and in other embodiments that are not shown, a hole transport layer may exists between the hole injection layer 112 and the organic light-emitting layer 114, and an electron transport layer may exist between the electron injection layer 116 and the organic light-emitting layer 114. Furthermore, the organic light-emitting layer 114 may be, a multi-layer structure formed by stacking a plurality of light-emitting material layers, in which the plurality of light-emitting material layers may, for example, emit color light of different colors, and the color light is mixed into white light.

The color filter 120 is disposed on the OEL device 110, and may include a red filter unit 122, a green filter unit 124, and a blue filter unit 126. Moreover, the filter spectrum of the color filter 120 matches the spectrum of light emitted by the OEL device 110, and the color filter 120 is used for converting the light emitted by the OEL device 110 into color light, and outputting and mixing the color light into a color screen. For example, the OEL device 110 of this embodiment may emit white light having three bands, and a curve of a relationship of the light intensity and the wavelength has a peak in a band of 420 nm to 480 nm, a band of 480 nm to 540 nm, and a band of 590 nm to 650 nm.

Furthermore, the display apparatus 100 needs to meet special display requirements at different applications. For example, when being applied in a television (TV), the display apparatus 100 needs to have a high display color temperature, and the CCT of a white screen displayed by the display apparatus 100 is usually set in the rage of 8000K to 12000K. Or, when being applied in a monitor of an electronic apparatus, the display apparatus 100 needs to have a low display color temperature, and the CCT of the white screen displayed by the display apparatus 100 is usually set in the range of 4500K to 8500K. In this case, in order to meet the display requirement of the specific CCT, in this embodiment, the light emitting spectrum of the OEL device 110 can be adjusted.

Specifically, when the CCT of the white screen displayed by the display apparatus 100 is set in the range of 8000K to 12000K, the light emitting spectrum of the OEL device 110 is adjusted in this embodiment, so that a curve of a relationship between the light intensity and the wavelength of the white screen displayed by the display apparatus 100 has a first peak in a band of 420 nm to 480 nm, a second peak in a band of 480 nm to 540 nm, and a third peak in a band of 590 nm to 650 nm, and a ratio of the second peak to the first peak is, for example, in the range of 0.31 to 0.40, and a ratio of the third peak to the first peak is, for example, in the range of 0.24 to 0.32.

On the other hand, when the CCT of the white screen displayed by the display apparatus 100 is set in the range of 4500K to 8500K, the light emitting spectrum of the OEL device 110 is adjusted in this embodiment, so that a curve of a relationship of the light intensity and the wavelength of the white screen displayed by the display apparatus 100 has a first peak in a band of 420 nm to 480 nm, a second peak in a band of 480 nm to 540 nm, and a third peak in a band of 590 nm to 650 nm, and a ratio of the second peak to the first peak is in the range of 0.43 to 0.52, and a ratio of the third peak to the first peak is in the range of 0.34 to 0.42.

In practical fabrication, for example, the material weight percentages of light-emitting material layers in the organic light-emitting layer 114 in the OEL device 110 may be changed, or the thickness of the light-emitting material layers may be changed, or the current flowing through the light-emitting material layer may be changed, so as to adjust the light emitting spectrum of the OEL device 110.

Figure 2:
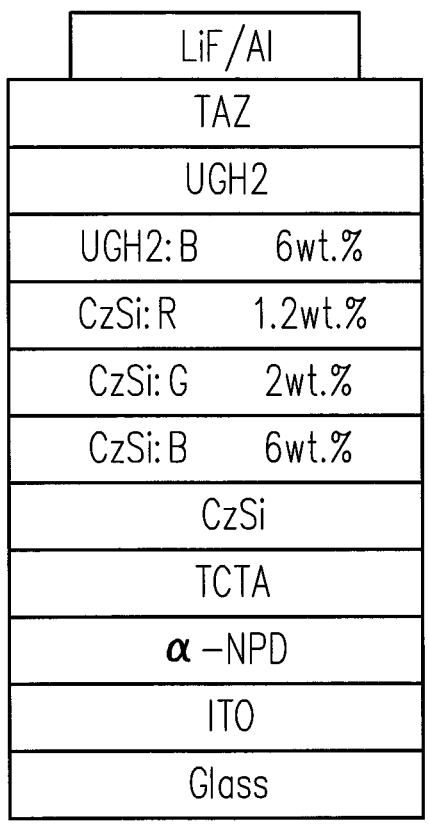
FIG. 2 shows an OEL device formed by light-emitting material layers of different material weight percentages according to an embodiment of the present invention.

For example, FIG. 2 shows an OEL device 200 formed by light-emitting material layers of different material weight percentages according to an embodiment of the present invention. As shown in FIG. 2, the material weight percentage of a UGH2 layer for emitting blue light is 6%, the material weight percentage of a CzSi layer for emitting red light is 1.2%, the material weight percentage of a CzSi layer for emitting green light is 2%, and the material weight percentage of a CzSi layer for emitting blue light is 6%. The material weight percentages of the light-emitting material layers are adjusted, so that the display apparatus 100 can provide good viewing quality.

The materials of relevant layers in FIG. 2 are described below. TAZ, serving as an electron transport layer, is 3-(4-biphenylyl)-4-phenyl-5-(4-tert-butylphenyl)-1,2,4-triazole; UGH2 is p-bis(triphenylsilyl)benzene; CzSi:R refers to a material for emitting red light, CzSi:G refers to a material for emitting green light; and CzSi:B refers to a material for emitting blue light, in which CzSi is 3,6-bis(triphenylsilyl)carbazole, and is also referred to as bis(triphenylsilyl)carbazole; TCTA, serving as a hole transport layer, is 4,4',4"-tri(N-carbazolyl)triphenylamine; α-NPD, serving as a hole transport layer, is 4,4'-bis[N-(1-naphthyl)-N-phenyl-amino]biphenyl).

Figure 3:
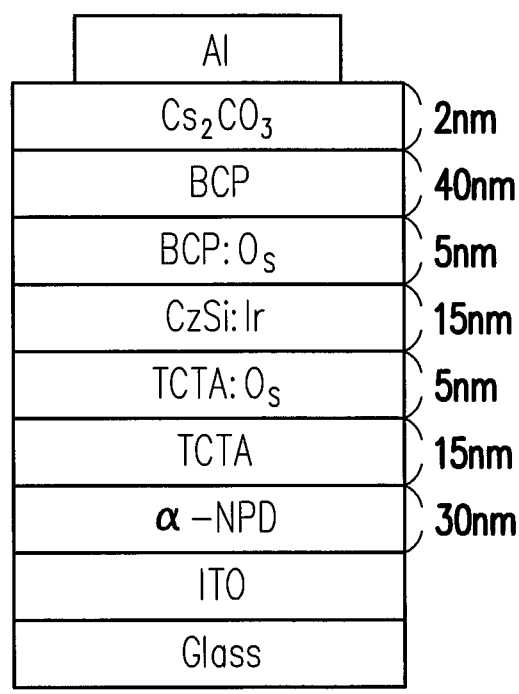
FIG. 3 shows an OEL device formed by light-emitting material layers of different thicknesses according to an embodiment of the present invention.

For example, FIG. 3 shows an OEL device 300 formed by light-emitting material layers of different thicknesses according to an embodiment of the present invention. As shown in FIG. 3, the thickness of a $Cs_2CO_3$ layer is 2 nm, the thickness of a BCP layer is 40 nm, the thickness of a BCP:Os layer is 5 nm, the thickness of a CzSi:Ir layer is 15 nm, the thickness of a TCTA:OS layer is 5 nm, the thickness of a TCTA layer is 15 nm, and the thickness of an α-NPD layer is 30 nm. The thickness of the light-emitting material layers is changed, so that the display apparatus 100 can provide good viewing quality.

The materials of relevant layers in FIG. 3 are described below. BCP is (2,9-dimethyl-4,7-diphenyl-1,10-phenanthroline); BCP:Os is an osmium complex, in which osmium is a transition metal; CzSi:Ir is an iridium complex, in which iridium is an transition metal; TCTA:OS is an osmium complex, in which osmium is a transition metal; TCTA, serving as a hole transport layer, is 4,4',4"-tri(N-carbazolyl)triphenylamine; and α-NPD, serving as a hole transport layer, is 4,4'-bis[N-(1-naphthyl)-N-phenyl-amino]biphenyl).

Herein, it is briefly illustrated that the light emitting spectrum of the OEL device 110 can be adjusted by, but not limited to, changing the material weight percentages of the light-emitting material layers in the organic light-emitting layer 114 in the OEL device 110 and the thickness of the light-emitting material layer, so as to provide good viewing quality.

Through the above design, when the CCT of the white screen displayed by the display apparatus 100 is in the range of 8000K to 12000K or 4500K to 8500K, the color performance in the CIE1931 chromaticity diagram that can be achieved are:

$0.63 \leq Rx \leq 0.65$, $0.32 \leq Ry \leq 0.345$;
$0.285 \leq Gx \leq 0.315$, $0.59 \leq Gy \leq 0.615$;
$0.135 \leq Bx \leq 0.155$, $0.04 \leq By \leq 0.065$; and
$0.27 \leq Wx \leq 0.33$, $0.28 \leq Wy \leq 0.35$.

Figure 4:
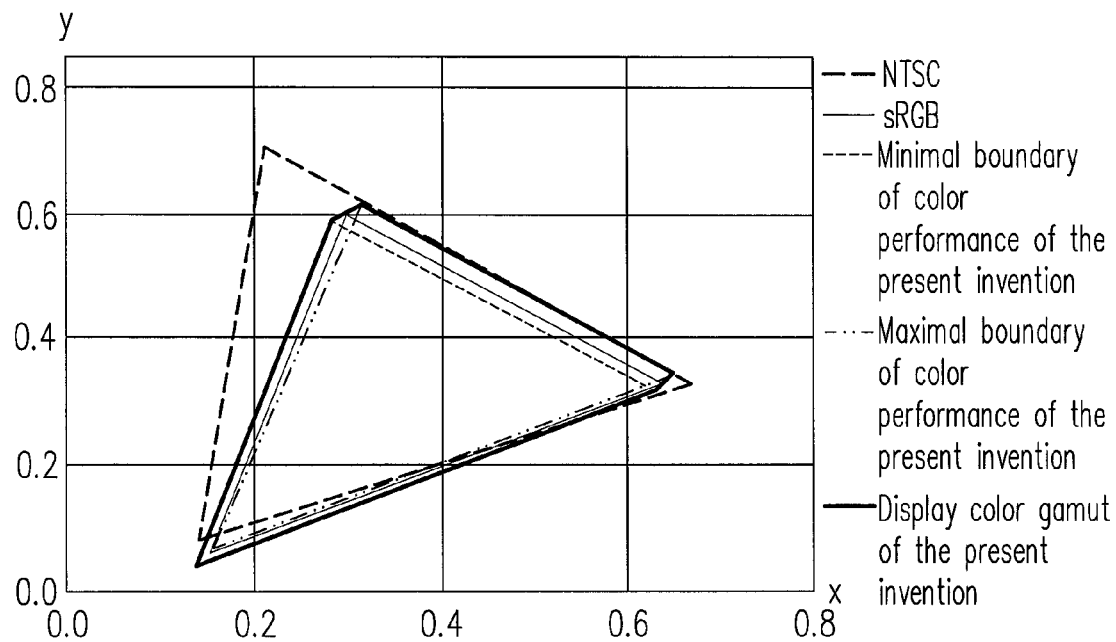
FIG. 4 is a comparison diagram of a display color gamut, a NTSC color gamut, and an sRGB color gamut according to this embodiment.

FIG. 4 is a comparison diagram of a display color gamut, a NTSC color gamut, and an sRGB color gamut according to this embodiment. The display color gamut is a region between a maximal boundary and a minimal boundary. It can be know from FIG. 4, the color performance of the display apparatus 100 of this embodiment, regardless of the National Television System Committee (NTSC) specifications or the sRGB color gamut, is significantly improved, as compared with the conventional display apparatuses.

In Table 1, results obtained by simulation in a required CCT range of 8000K to 12000K when the design specification of the foregoing embodiment of the present invention is applied in a display apparatus are listed.

TABLE 1

| CIE coordinate | Red (R) | | | Green (G) | | | Blue (B) | | |
|---|---|---|---|---|---|---|---|---|---|
| | x | y | Y | x | y | Y | x | y | Y |
| original value | 0.657 | 0.328 | 21.62 | 0.315 | 0.600 | 60.47 | 0.133 | 0.080 | 5.29 |
| 9300K | 0.641 | 0.322 | 17.91 | 0.290 | 0.605 | 58.61 | 0.137 | 0.060 | 8.39 |
| 8300K | 0.635 | 0.323 | 18.51 | 0.293 | 0.612 | 58.20 | 0.137 | 0.060 | 7.64 |
| 11000K | 0.630 | 0.320 | 18.06 | 0.291 | 0.610 | 56.96 | 0.137 | 0.057 | 8.61 |

| CIE coordinate | White light | | | NTSC percentage | sRGB percentage |
|---|---|---|---|---|---|
| | x | y | Y | | |
| Original value | 0.360 | 0.376 | 29.13 | 71.9 | 94.5 |
| 9300K | 0.284 | 0.291 | 28.30 | 74.1 | 99.0 |
| 8300K | 0.292 | 0.302 | 28.12 | 74.0 | 98.0 |
| 11000K | 0.277 | 0.277 | 27.88 | 73.3 | 97.2 |

Figure 5:
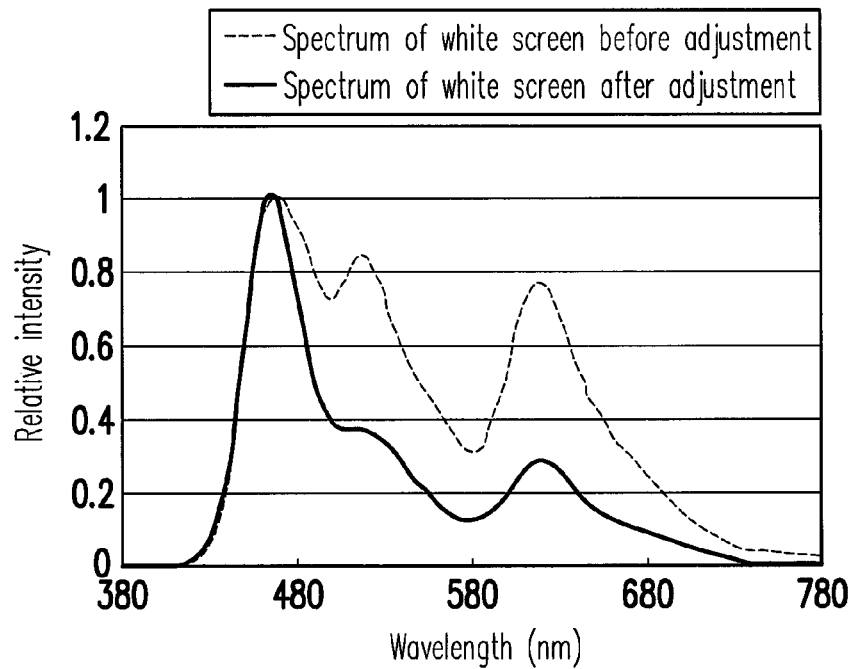
FIG. 5 is a curve chart of the light intensity and the wavelength of a white screen displayed by a display apparatus before and after a light emitting spectrum of an OEL device is adjusted when a required CCT is 9300K according to the present invention.

FIG. 5 further shows a curve chart of the light intensity and the wavelength of a white screen displayed by a display apparatus before and after the light emitting spectrum of an OEL device is adjusted at a CCT of 9300K in Table 1. The relationship curve after adjustment is as shown in Table 2, when the wavelength is 465 nm, 512 nm, and 619 nm, the relative intensity is 1.01 (first peak), 0.37 (second peak), and 0.29 (third peak) respectively. A ratio of the second peak to the first peak is 0.37, which is in the range of 0.31 to 0.40 that is specified in the foregoing embodiment, and a ratio of the third peak to the first peak is 0.283, which is in the range of 0.24 to 0.32 that is specified in the foregoing embodiment. Furthermore, Table 3 and Table 4 respectively list the peak characteristics of the light emitting spectrum of the OEL device when the CCT is 8300K and 11000K, which are also in the range that are specified in the foregoing embodiment.

TABLE 2

CCT: 9300K

| wavelength (nm) | Intensity | Ratio |
|---|---|---|
| 465 | 1.01 | 1.000 |
| 512 | 0.37 | 0.370 |
| 619 | 0.29 | 0.283 |

TABLE 3

CCT: 8300K

| wavelength (nm) | Relative intensity | Ratio |
|---|---|---|
| 465 | 0.93 | 1.000 |
| 512 | 0.37 | 0.402 |
| 619 | 0.29 | 0.308 |

TABLE 4

CCT: 11000K

| wavelength (nm) | Relative intensity | Ratio |
|---|---|---|
| 465 | 1.15 | 1.000 |
| 512 | 0.38 | 0.327 |
| 619 | 0.29 | 0.249 |

Based on the above, it can be known from the simulation results in Table 1 that, the NTSC percentage and the sRGB percentage of the display apparatus adopting the design specification of the present invention at a color temperature of 8300K, 9300K, and 11000K are higher than the original values of the display apparatus that does not adopt the design specification of the present invention, and the color performance are significantly improved, as compared with the conventional display apparatuses.

In Table 5, results obtained by simulation in a required CCT range of 4500K to 8500K when the design specification of the foregoing embodiment of the present invention is applied in a display apparatus are listed.

TABLE 5

| CIE coordinate | Red (R) | | | Green (G) | | | Blue (B) | | |
|---|---|---|---|---|---|---|---|---|---|
| | x | y | Y | x | y | Y | x | y | Y |
| Original value | 0.652 | 0.328 | 22.06 | 0.314 | 0.602 | 60.17 | 0.134 | 0.069 | 4.02 |
| 6500K | 0.641 | 0.325 | 19.35 | 0.296 | 0.607 | 59.44 | 0.137 | 0.058 | 5.66 |
| 6900K | 0.642 | 0.325 | 19.48 | 0.297 | 0.607 | 59.79 | 0.136 | 0.059 | 5.40 |
| 6000K | 0.638 | 0.324 | 19.15 | 0.295 | 0.606 | 58.93 | 0.137 | 0.056 | 60.4 |

| CIE coordinate | White light | | | NTSC percentage | sRGB percentage |
|---|---|---|---|---|---|
| | x | Y | Y | | |
| Original value | 0.368 | 0.382 | 28.75 | 72.5 | 94.5 |
| 6500K | 0.315 | 0.330 | 28.15 | 74.0 | 99.2 |
| 6900K | 0.321 | 0.339 | 28.23 | 74.1 | 99.2 |
| 6000K | 0.307 | 0.318 | 28.04 | 73.7 | 98.9 |

Figure 6:
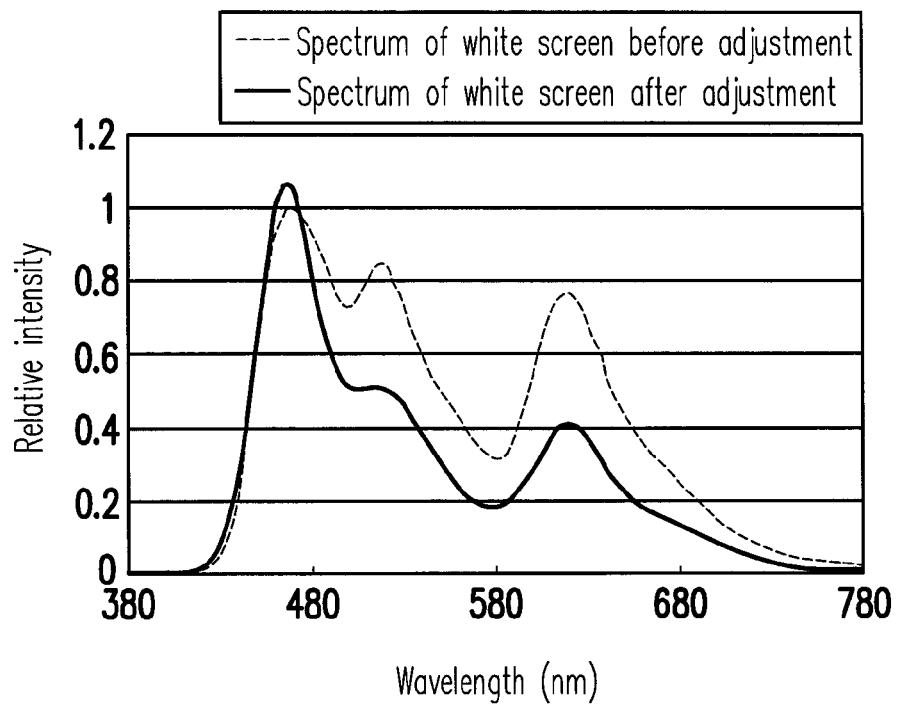
FIG. 6 is a curve chart of the light intensity and the wavelength of a white screen displayed by a display apparatus before and after a light emitting spectrum of an OEL device is adjusted when a required CCT is 6500K according to the present invention.

FIG. 6 further shows a curve chart of the light intensity and the wavelength of a white screen displayed by a display apparatus before and after the light emitting spectrum of an OEL device is adjusted at a required CCT of 6500K. The relationship curve after adjustment is as shown in Table 6, when the wavelength is wavelength 465 nm, 512 nm, and 619 nm, the relative intensity is 1.06 (first peak), 0.51 (second peak), and 0.41 (third peak) respectively. A ratio of the second peak and the first peak is 0.481, which is in the range of 0.43 to 0.52 that is specified in the foregoing embodiment, and a ratio of the third peak to the first peak is 0.386, which is in the range of 0.34 to 0.42 that is specified in the foregoing embodiment. Furthermore, Table 7 and Table 8 respectively list the peak characteristics of the light emitting spectrum of the OEL device when the CCT is 8300K and 11000K, which are also in the range that is specified in the foregoing embodiment.

TABLE 6

CCT: 6500K

| wavelength (nm) | Intensity | Ratio |
|---|---|---|
| 465 | 1.06 | 1.000 |
| 512 | 0.51 | 0.481 |
| 619 | 0.41 | 0.386 |

TABLE 7

CCT: 6900K

| wavelength (nm) | Relative intensity | Ratio |
|---|---|---|
| 465 | 0.98 | 1.000 |
| 512 | 0.51 | 0.520 |
| 619 | 0.41 | 0.417 |

TABLE 8

CCT: 6000K

| wavelength (nm) | Relative intensity | Ratio |
|---|---|---|
| 465 | 1.19 | 1.000 |
| 512 | 0.51 | 0.432 |
| 619 | 0.41 | 0.346 |

Based on the above, it can be known from the simulation results in Table 5 that, the NTSC percentage and the sRGB percentage of the display apparatus adopting the design specification of the present invention at a color temperature of 6500K, 6900K, and 6000K are higher than the original values of the display apparatus that does not adopt the design specification of the present invention, and the color performance are significantly improved, as compared with the conventional display apparatuses.

Through the simulation, it is verified that, in the display apparatus of the present invention, the light emitting spectrum of the OEL device can be adjusted when the CCT is in the range of 4500K to 8500K and the range of 8000K to 12000K, so as to achieve specific display requirements and improve the display quality of the display apparatus.

In addition, the color filter is a factor that influences the display quality of the display apparatus, so in the present invention, the filter spectrum of the color filter is also adjusted to match the light emitting spectrum of the OEL device, so that that the display apparatus can achieve good display effect.

Figure 7:
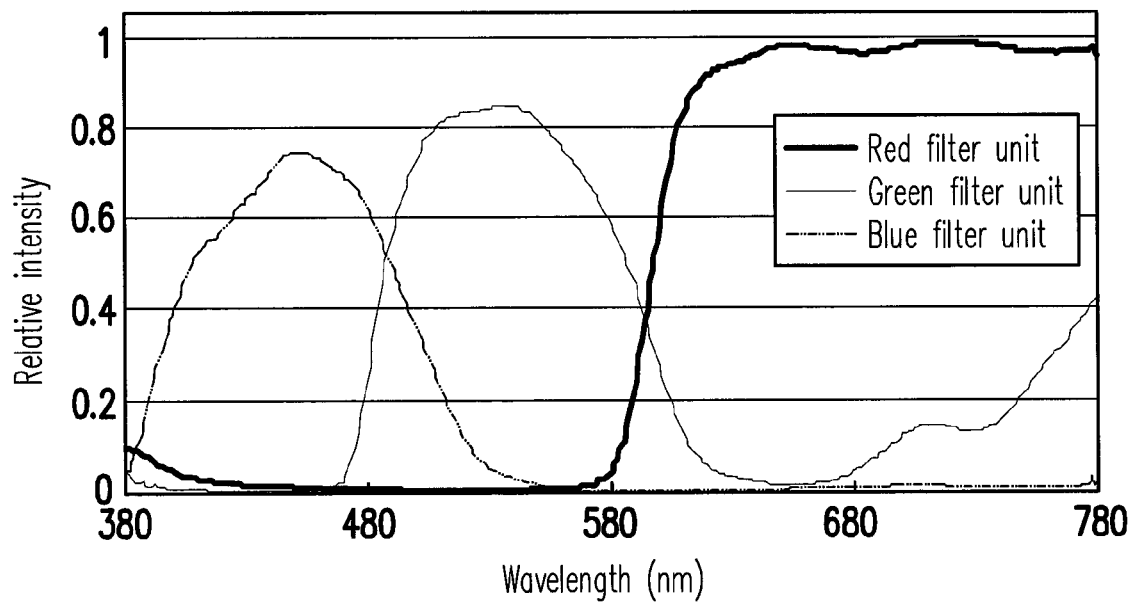
FIG. 7 is a curve chart of the filter wavelength and the light intensity of color filter units of the color filter adopted in an embodiment of the present invention.

FIG. 7 is a curve chart of the filter wavelength and the light intensity of color filter units of the color filter adopted in an embodiment of the present invention As shown in FIG. 6, a curve of a relationship between the filter wavelength and the light intensity of the color filter has a fourth peak in a band of 30 nm to 460 nm and a fifth peak in a band of 510 nm to 560 nm respectively, and the fifth peak is greater than the fourth peak. Furthermore, a ratio of the light intensity when the filter wavelength of the color filter is 650 nm to the light intensity when the filter wavelength is 580 nm is greater than 18. Specifically, taking the color filter of this embodiment as an example, when the wavelength of the blue filter unit is 450 nm, the relative intensity is greater than 0.6; when the wavelength of the green filter unit is 530 nm, the relative intensity is greater than 0.8; and a ratio of the relative intensity when the filter wavelength of the red filter unit is 650 nm to of the relative intensity when the filter wavelength is 580 nm is 18.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A display apparatus, comprising:
an organic electroluminescence device, for emitting a light, wherein a curve of a relationship between the wavelength and the light intensity of the light has a peak in a band of 420 nm to 480 nm, a band of 480 nm to 540 nm, and a band of 590 nm to 650 nm respectively; and a color filter, for receiving and converting the light into a color light, wherein a correlated color temperature (CCT) of a white screen displayed by the display apparatus is in the range of 8000K to 12000K, and a curve of a relationship between the wavelength and the light intensity of the white screen has a first peak in a band of 420 nm to 480 nm, a second peak in a band of 480 nm to 540 nm, and a third peak in a band of 590 nm to 650 nm respectively, and a ratio of the second peak to the first peak is in the range of 0.31 to 0.40.

2. The display apparatus according to claim 1, wherein a ratio of the third peak to the first peak is in the range of 0.24 to 0.32.

3. The display apparatus according to claim 1, having the following color performance in CIE1931 chromaticity diagram:
0.63≦Rx≦0.65, 0.32≦Ry≦0.345;
0.285≦Gx≦0.315, 0.59≦Gy≦0.615;
0.135≦Bx≦0.155, 0.04≦By≦0.065; and
0.27≦Wx≦0.33, 0.28≦Wy≦0.35.

4. The display apparatus according to claim 1, wherein a curve of a relationship between the filter wavelength and the light intensity of the color filter has a fourth peak in a band of 430 nm to 460 nm, and a fifth peak in a band of 510 nm to 560 nm respectively, and the fifth peak is greater than the fourth peak.

5. The display apparatus according to claim 1, wherein a ratio of the light intensity when the filter wavelength of the color filter is 650 nm to the light intensity when the filter wavelength is 580 nm is greater than 18.

6. A display apparatus, comprising:
a white light organic electroluminescence device, for emitting a white light, wherein a curve of a relationship between the wavelength and the light intensity of the white light has a peak in a band of 420 nm to 480 nm, a band of 480 nm to 540 nm, and a band of 590 nm to 650 nm respectively; and a color filter, for receiving and converting the white light into a color light, wherein a correlated color temperature (CCT) of a white screen displayed by the display apparatus is in the range of 4500K to 8500K, and a curve of a relationship between the wavelength and the light intensity of the white screen has a first peak in a band of 420 nm to 480 nm, a second peak in a band of 480 nm to 540 nm, and a third peak in a band of 590 nm to 650 nm, and a ratio of the second peak to the first peak is in the range of 0.43 to 0.52.

7. The display apparatus according to claim 6, wherein a ratio of the third peak to the first peak is in the range of 0.34 to 0.42.

8. The display apparatus according to claim 6, having the following color performance in CIE1931 chromaticity diagram:
0.63≦Rx≦0.65, 0.32≦Ry≦0.345;
0.285≦Gx≦0.315, 0.59≦Gy≦0.615;
0.135≦Bx≦0.155, 0.04≦By≦0.065; and
0.27≦Wx≦0.33, 0.28≦Wy≦0.35.

9. The display apparatus according to claim 6, wherein a curve of a relationship between the filter wavelength and the light intensity of the color filter has a fourth peak in a band of 430 nm to 460 nm and a fifth peak in a band of 510 nm to 560 nm respectively, and the fifth peak is greater than the fourth peak.

10. The display apparatus according to claim 6, wherein a ratio of the light intensity when the filter wavelength of the color filter is 650 nm to the light intensity when the filter wavelength is 580 nm is greater than 18.

* * * * *